(12) United States Patent
Wyatt

(10) Patent No.: US 10,161,975 B2
(45) Date of Patent: Dec. 25, 2018

(54) METHOD AND SYSTEM FOR RADIO FREQUENCY (RF) SPECTRAL IMAGER ON AN INTEGRATED CIRCUIT

(71) Applicant: Harris Corporation, Melbourne, FL (US)

(72) Inventor: Michael A. Wyatt, Clearwater, FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 15/369,862

(22) Filed: Dec. 5, 2016

(65) Prior Publication Data

US 2018/0156850 A1    Jun. 7, 2018

(51) Int. Cl.
   *G01R 13/14*     (2006.01)
   *G01R 23/16*     (2006.01)
   *H04B 1/00*      (2006.01)

(52) U.S. Cl.
   CPC ............ *G01R 23/16* (2013.01); *H04B 1/0007* (2013.01)

(58) Field of Classification Search
   CPC .. G01R 13/345; G01R 13/26; G01R 13/0272; G01R 13/0236; G01R 13/029; G01R 13/30; G01R 13/22; G01R 23/16; G01R 23/173; G01R 23/165; G01R 27/28; G01R 19/04

USPC ......... 324/121 R, 76.19–76.38, 76.41–76.48, 324/76.52–76.62, 76.11–76.13, 76.18

See application file for complete search history.

(56) References Cited

U.S. PATENT DOCUMENTS

| | | | |
|---|---|---|---|
| 5,267,188 A * | 11/1993 | Pape .................... | G06E 3/005 708/821 |
| 2005/0057253 A1* | 3/2005 | Gee ...................... | G01R 13/02 324/409 |
| 2011/0280489 A1* | 11/2011 | Turpin .............. | G01R 13/0254 382/209 |
| 2011/0320148 A1* | 12/2011 | Hillman, Jr. ....... | G01R 13/0254 702/77 |
| 2012/0081105 A1* | 4/2012 | Hammerschmidt .... | G06F 1/025 324/76.19 |
| 2013/0158923 A1* | 6/2013 | Stanton ............. | G01R 13/0254 702/76 |
| 2013/0195226 A1* | 8/2013 | Maleh .................. | G01R 23/16 375/340 |
| 2017/0010744 A1* | 1/2017 | Hotelling ............. | G06F 3/0416 |

* cited by examiner

*Primary Examiner* — Thang X Le
(74) *Attorney, Agent, or Firm* — Davidson Berquist Jackson & Gowdey, LLP

(57) ABSTRACT

Methods and systems in accordance with the present invention provide an RF spectrum analyzer on a computer chip, such as an integrated circuit. They may provide RF spectrum analyzer functions on a much smaller scale, which is easier to implement, transport and install in other equipment. They present a single chip solution that is smaller, lighter and more compact than conventional systems. Additionally, they may be put in hand held (or smaller) devices.

15 Claims, 9 Drawing Sheets

METHOD AND SYSTEM FOR RADIO FREQUENCY (RF) SPECTRAL IMAGER ON AN INTEGRATED CIRCUIT

This generally relates to spectrum analyzers and more particularly to RF spectrum analyzers.

BACKGROUND

Spectrum analyzers such as Radio Frequency (RF) spectrum analyzers analyze radio frequency waves. By analyzing the spectra of electrical signals, a spectrum analyzer can determine frequency, power, distortion, harmonics, bandwidth, and other spectral components of an input signal. These parameters are useful in the characterization of electronic devices, such as wireless transmitters. Spectrum analyzers may also be used in Fast Fourier Transform functions for converting a time domain sequence of numbers or signals to a frequency domain.

They are typically used in laboratory settings to analyze devices that output radio frequencies, such as cell phones. For example, a cell phone manufacturer may test the output or input of a cell phone, Wi-Fi router, a laptop with Wi-Fi to determine the radio frequencies transmitted or received by the device. Such RF spectrum test equipment is made, for example, by companies such as Agilent (formerly of Hewlett Packard), Rohde & Schwarz, Tektronix and Anritsu. They also use to be made by Hewlett Packard.

RF spectrum analyzers may be used in electronic warfare or military applications, for example, to trick a radar by searching for a radar signal and returning an intentionally modified signal back. In this respect, they are also used in a Digital Radio Frequency Memory (DRFM) which is an electronic method for digitally capturing and retransmitting an RF signal, typically used in radar jamming. DRFM digitizes an RF signal with an Analog to Digital (A/D) converter, and possibly a down-converter which converts the frequency to a lower frequency to be converted to digital. The output of the A/D converter is stored in digital memory, and the digital memory is used by a processor to do desired signal processing. It is then passed to a digital to analog converter (D/A) converter and then amplified. It is also possibly up-converted in frequency and retransmitted. A DRFM system is designed to digitize an incoming RF input signal at a frequency and bandwidth necessary to adequately represent the signal, and then reconstruct that RF signal when required. A DRFM may modify the signal prior to retransmitting which can alter the signature of the false target, adjusting its apparent radar cross section, range, velocity, and angle, thereby presenting a significant obstacle for radar sensors.

However, conventional spectrum analyzers are very expensive, large and consume a lot of power. They are large, expensive pieces of equipment intended for laboratory settings, and may be, for example, two and a half feet long and deep and a foot tall, weighing roughly 60 pounds. They may also cost tens of thousands of dollars, for example. They are conventionally more specialized pieces of equipment that give a different view into the RF and microwave spectrum than one can get with an oscilloscope, for example.

Accordingly, there is a desire for an RF spectrum analyzer on a smaller scale and for lower pricing. Consequently, there is a desire to solve these and other related problems.

SUMMARY

In accordance with the present invention, a radio frequency (RF) spectrum analyzer on an integrated circuit is provided comprising an input configured to input an RF signal to be analyzed and convert the input signal into a current. The RF spectrum analyzer also compromises an RF pixel circuit configured to receive the current representing the input signal and output a second current based on the received current and dimensions of components in the RF pixel circuit. The RF spectrum analyzer further comprises an output frequency bin circuit representing signals from a frequency span and configured to input the second current from the RF pixel circuit, store the difference between the second current and a third current input from the RF pixel, and output the difference current to an A/D converter. The RF spectrum analyzer also comprises an analog-to-digital (A/D) converter configured to receive the difference current from the output frequency bin circuit, and output a digital representation of the frequency domain of the received input RF signal.

In another embodiment, a method in a radio frequency (RF) spectrum analyzer on an integrated circuit is provided, comprising receiving an input RF signal to be analyzed on the integrated circuit, converting the input RF signal into a current. The method further comprises receiving, by an RF pixel circuit, the current representing the input signal, and outputting, from the RF pixel circuit, a second current based on the received current and dimensions of components in the RF pixel circuit. Additionally, the method comprises inputting, into an output frequency bin circuit representing signals from a frequency span, the second current from the RF pixel circuit, storing the difference between the second current and a third current input from the RF pixel in the output frequency bin circuit, and outputting the difference current to an analog-to-digital (A/D) converter. Finally, the method comprises receiving, by the A/D converter, the difference current from the output frequency bin circuit, and outputting a digital representation of the frequency domain of the received input RF signal.

In yet another embodiment, a method in a radio frequency (RF) spectrum analyzer on a single integrated circuit is provided, comprising receiving an input RF to be analyzed on the single integrated circuit and outputting a digital representation of the frequency domain of the received input RF signal.

In accordance with another implementation, a radio frequency (RF) spectrum analyzer on a single integrated circuit is provided, comprising the single integrated circuit configured to receive an input RF signal to be analyzed; and output a digital representation of the frequency domain of the received input RF signal.

DETAILED DESCRIPTION

Figure 1:
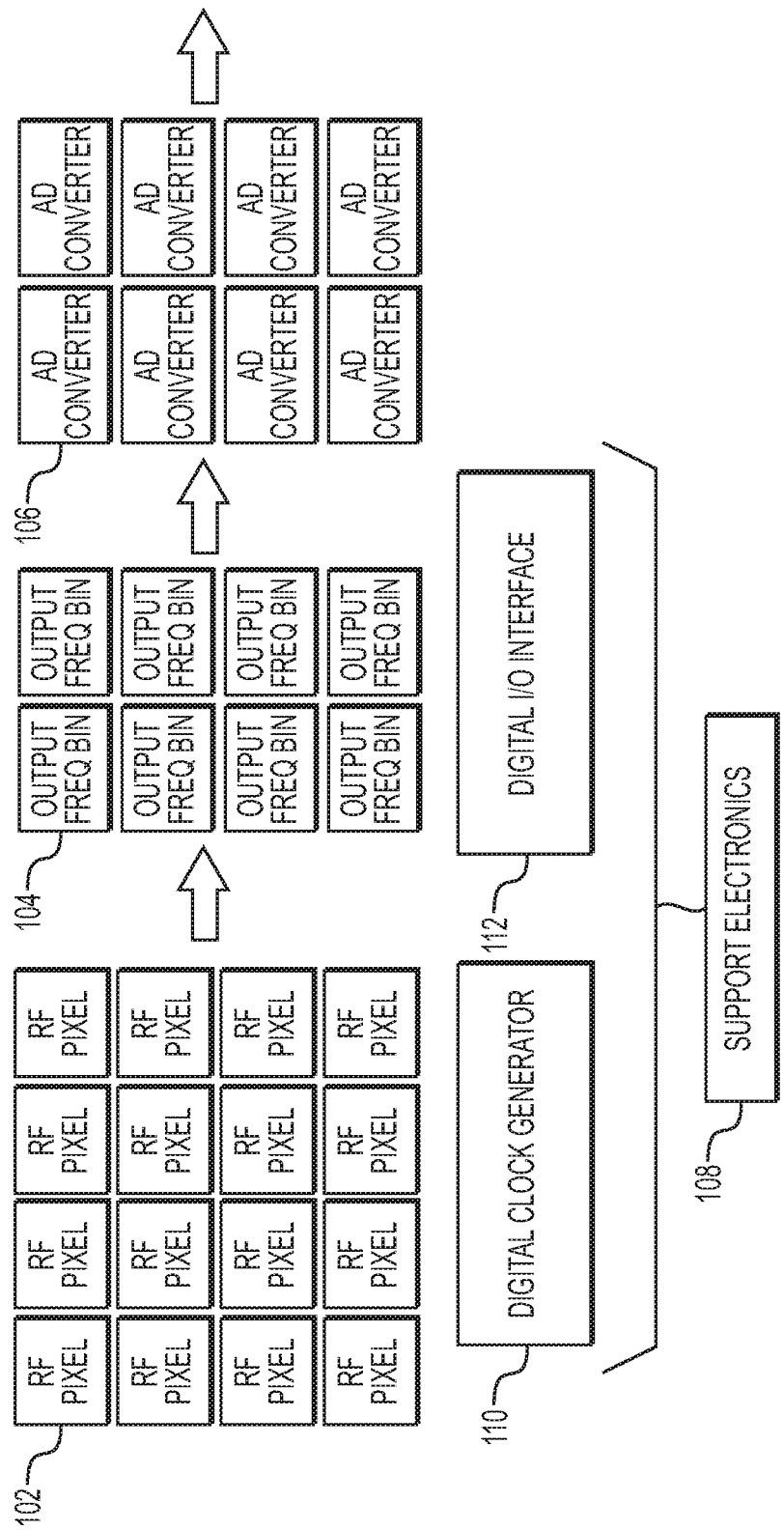
FIG. 1 illustrates an overview of an exemplary single chip RF A00 imager in accordance with the present invention.

Methods and systems in accordance with the present invention provide an RF spectrum analyzer on a computer chip, such as an integrated circuit. They may provide RF spectrum analyzer functions on a much smaller scale, which is easier to implement, transport and install in other equipment. They present a single chip solution that is smaller, lighter and more compact than conventional systems. Additionally, they may be put in hand held (or smaller) devices. The RF spectrum analyzer analyzes the spectrum on an input signal. The RF spectrum analyzer receives and captures the input signals, and outputs a digital representation of the frequency domain of the input signal that allows viewing of the spectrum frequency domain.

As discussed herein, RF spectrum refers to the radio frequency spectrum and includes the microwave spectrum. Other types of RF spectrum analyzers include optical spectrum analyzers and audio spectrum analyzers. In one implementation, the RF spectrum analyzer applies to the RF spectrum (and microwaves), but not optical spectrum or audio spectrum.

The RF spectrum analyzer chip performs a Fast Fourier Transform, which is for converting a time domain sequence and translating it into the frequency domain. It captures the input signal to be analyzed, performs a Fast Fourier conversion and digitizes the result. The output is then the frequency domain rather than the time domain. The time domain is what is viewed on an oscilloscope, and frequency domain is viewed on a spectrum analyzer. Analog Fast Fourier Transform is performed right on the chip whereas the chip may be a Fast Fourier Transform engine.

The single chip RF spectral imager may incorporate some techniques similar to those in advanced CMOS image sensors found in modern cameras. Camera CMOS sensors capture a view of the visible electromagnetic spectrum by converting visible wavelength photons into charge stored on a small integrated capacitor called a pixel. The charge on the capacitor represents the time integration of the photons captured over the exposure time, or the photon intensity. By arranging an array of pixels an image is captured representing the field of view of the sensor, usually dictated by the camera lens.

The RF spectral imager captures a "view" of the RF spectrum in a manner analogous to camera CMOS sensors except the "RF image" is captured sequentially whereas the camera sensor exposes all the pixels simultaneously. A sample of the RF signal is captured on an RF pixel (described below) at time t; another sample is captured on another pixel at t+t, where t, is the sample period. This process repeats with a total of N samples being captured on N RF pixels, creating a total time capture of N*t. Together this represents an analog RF memory, which has a time span of N*t, and a sample rate of 1/t. The RF pixel is a sample and hold type function with the time sample being captured on a single NMOS transistor.

In one implementation, the RF spectrum analyzer on a chip sacrifices some of the more extensive high-end additional features and extent of flexibility (high programmability over broad frequency ranges) of laboratory-sized conventional RF spectrum analyzers. In this implementation, they may provide lower performance in trade off for significant reduced size, weight and power consumption. For example, they may capture a section of the RF spectrum in a small form factor with reasonable resolution and with reasonable dynamic range. The chip may be implemented in a CMOS process, which affords the designer to scale in size. The frequency coverage performance may be related to the advances in CMOS processes. As CMOS processes get smaller and smaller, they subsequently get faster and faster, which also allows the RF imager to process higher frequencies.

The RF imager chip includes an array of "RF pixels." These pixels are used to capture a time span of the instantaneous signals that are coming into the RF imager. The length of time that these signals are captured is directly related to how many RF pixels there are and the time sample. Each pixel captures the instantaneous signal for a specified time sample. The total sampling time is the time sample length multiplied by the number of RF pixels for example. If the time sample is 1 microsecond and there are 1,000 RF pixels, the total time is 1 millisecond (which is 1,000×1 microsecond). The total length of time is controlled by how many RF pixels and time spacing between any one of those pixels.

The frequency detected is related to how fast the sampling is set to occur. There is a highest frequency that can be processed and a lowest frequency that can be resolved. The highest frequency that can be processed is 1 divided by 2 times the sample rate (or one half the sample rate). For example, if there is a 1 µs sample rate, the highest frequency is 500 kHz.

The lowest frequency is related to how long those samples are captured, i.e., the length of time is the sample rate times the number of RF pixels. For example, for a sample rate of 1 megahertz (1 microsecond per sample), the sample rate times the number of RF pixels provides the time span of 1 millisecond. The length of time RF signal would be captured defines the lowest frequency resolution and how low a frequency can be resolved.

FIG. 1 illustrates an overview of an exemplary single chip RF imager 100. As shown, the exemplary chip discloses 16 RF pixels 102 in a 4×4 configuration. Any number of RF pixels 102 may be used, and the particular number and configuration shown is shown as a simple example for clarity. The RF pixels 102 are circuits which are described in greater detail below. Also shown are output frequency bins 104 which are also circuits and analog-to-digital ("A/D") converters 106, which are described further below. There are also support electronics 108 including a digital clock generator 110 and a digital I/O interface 112. Generally, the RF input signal to be analyzed enters the RF pixels 102, and the output from the RF pixels goes into the output frequency bins 104. Then the output from the output frequency bins 104 enters the A/D converters 106 to be transformed into the digital representation of the frequency domain of the input signal, which allows viewing of it.

Figure 2:
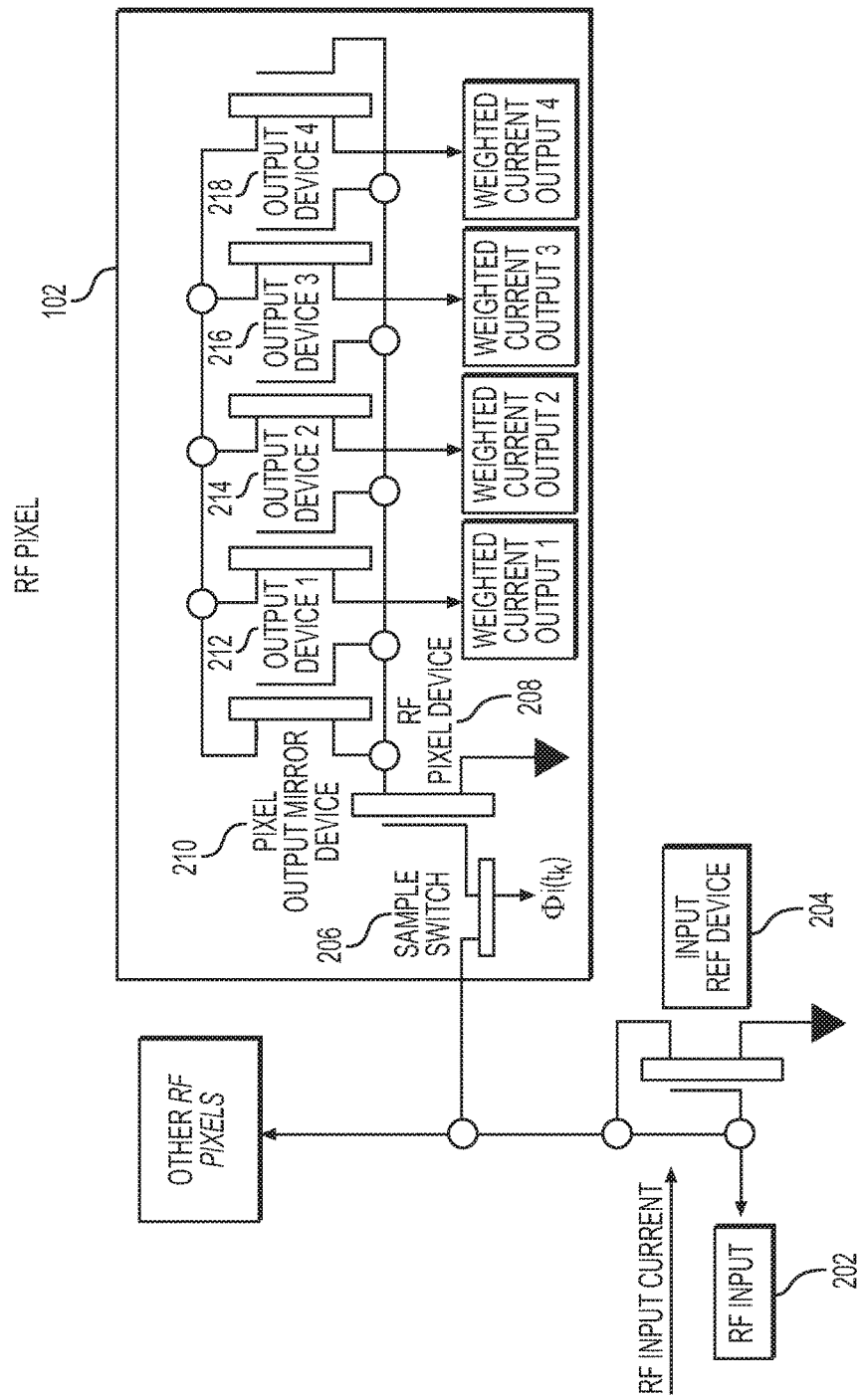
FIG. 2 depicts the components of an exemplary RF pixel in accordance with the present invention.

FIG. 2 depicts the components of an exemplary RF pixel 102. Whereas a group of RF pixels 102 is shown in FIG. 1, an individual RF pixel 102 is shown in FIG. 2 with additional detail. As shown, there is an RF input 202, which may be connected to an antenna, cable or other suitable input and receives the input signal to be analyzed. There is also an input reference device 204 that converts the input signal into a current. It acts as a transconductor to convert the RF input signal into an electrical current. This input reference device 204 may be an NMOS device, for example. The input reference device 204 current is shown connected to and going to the sample switch 206. This sample switch 206 may also be an NMOS device. Each sample switch 206 may have a different clock—when one turns off, then the next one turns on, and then when that one turns off, the next one turns on, etc. In one implementation, each sample switch 206 turns on serially, while the others turn off.

When the sample switch 206 is turned on (and the circuit is closed), the input reference device 204 current goes to the RF pixel device 208. This may be another NMOS device. The RF pixel device 208 stores a charge that is the same as the input reference device 204. The RF pixel device 208 will conduct same current as the input reference device 204, whereas the RF pixel device 208 is a replica of the input reference device 204.

In one implementation, the RF pixel device 208, an NMOS transistor, is used to capture and store an RF waveform current in a single device. When the sample switch 206 is on (closed), the RF pixel device 208 is developing a replica of the current from the input reference device 204. When the sample switch 206 turns off (opens), the RF pixel device 208 stays the same current as the input reference device 204 for a suitable amount of time. Therefore, the RF pixel device 208 captures the instantaneous RF current and stores it, without any additional circuitry. This mechanism assists in performing other parts of the process.

The pixel output mirror device 210 also stores this same charge. When the sample switch 206 is turned off (the switch is opened), the gate of the RF pixel device 208 stores the same charge it took to sustain the same current even when sample switch is off, for a brief period of time. The other components, the output devices 1-4 (212-218) may be, for example, P-channel devices with opposite polarity. They produce a current that is a mirror of the pixel output mirror device 210 and is related to the current of that device. Output devices 1-4 (212-218) mirror the current of the pixel output mirror device 210.

The current output for each output device 1-4 (212-218) is described in the following equation below. The relation is described with respect to the physical device dimensions created when the chip is fabricated. In the equation, A is the width divided by the length of the input reference device's 204 dimensions when built. B is the width divided by the length of RF pixel device's 208 dimensions when built. C is the width divided by the length of pixel output mirror device's 208 dimensions when built. D is the width divided by the length of the output device's 212-218 dimension when built. Φ(tk) is the "ith" sample switch 206 clock phase at time tk. Current Out (Iout(tk)) is the weighted output current at time tk. Current In (Iin(tk)) is the RF input 202 current at time tk.

$$Iout(tk)=Iin(tk)[B/A*D/C]$$

A is the width divided by length of input reference device's 204 dimensions when built B is the width and length RF pixel device's 208 dimensions when built C is the width and length pixel output mirror device's 210 dimension when built.

D is the width and length of the output device's 212-218 dimension when built.

Figure 3:
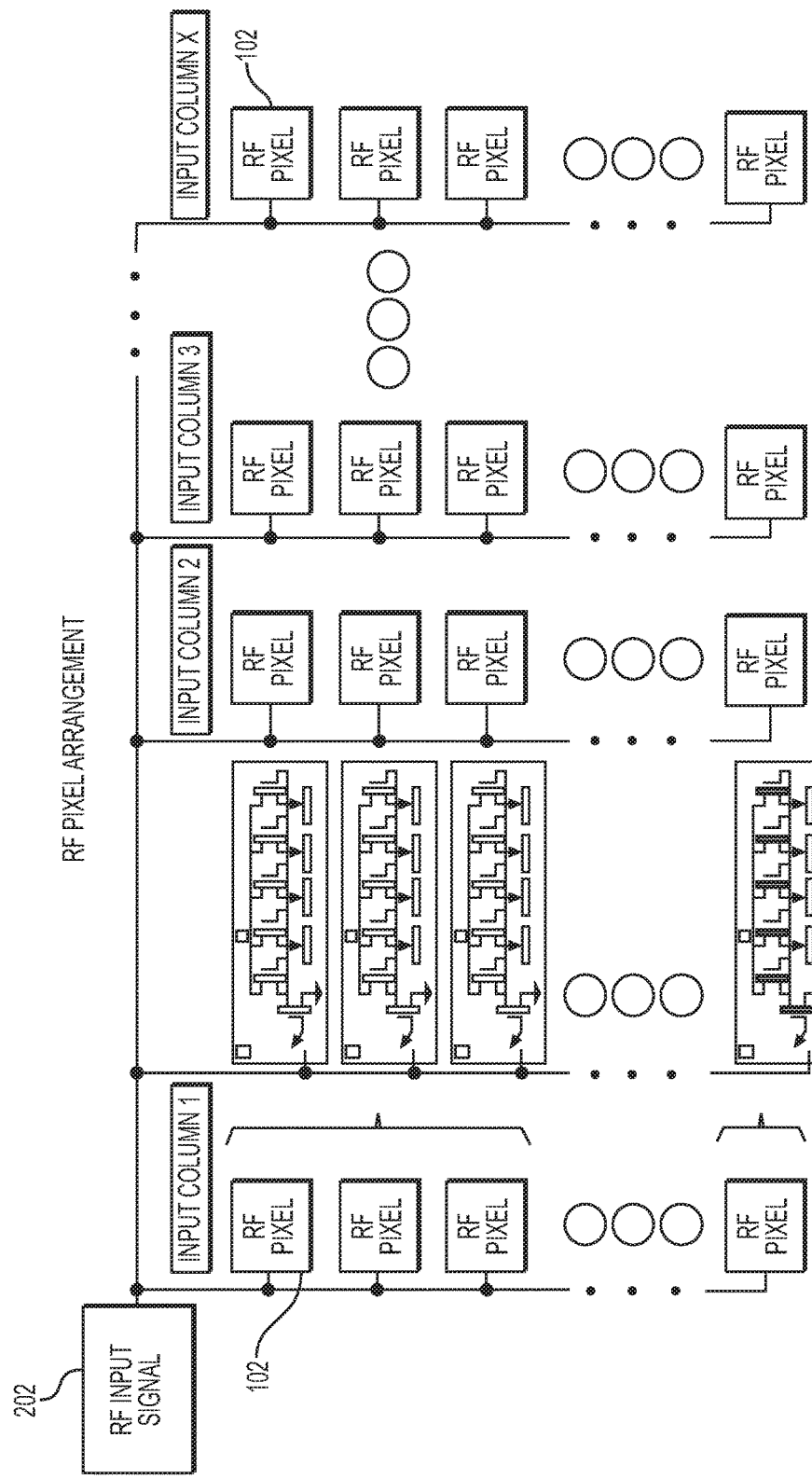
FIG. 3 shows an exemplary topology of the RF pixels may be arranged in one embodiment.

FIG. 3 shows an exemplary topology and arrangement of RF pixels 102 in one embodiment. As shown, they may be arranged in columns. However, other arrangements may be used.

The RF pixels 102 yield a Fourier Transform of the input. Traditionally this is done by digital techniques where the RF sample is multiplied and summed with other signals and captured in a way that produces a Fourier Transform, called a Fast Fourier Transform. In one embodiment, an analog technique is used, and the RF waveform is not put into the digital domain and remains in the analog domain, where the signal has continuous amplitude but discrete time, and the signals are captured are multiplied and summed.

The weighted current outputs 212-218 of the RF pixels 102 are routed to the inputs of the output frequency bins. Those weighted current outputs 212-218 are used to expand the RF pixels.

Figure 4:
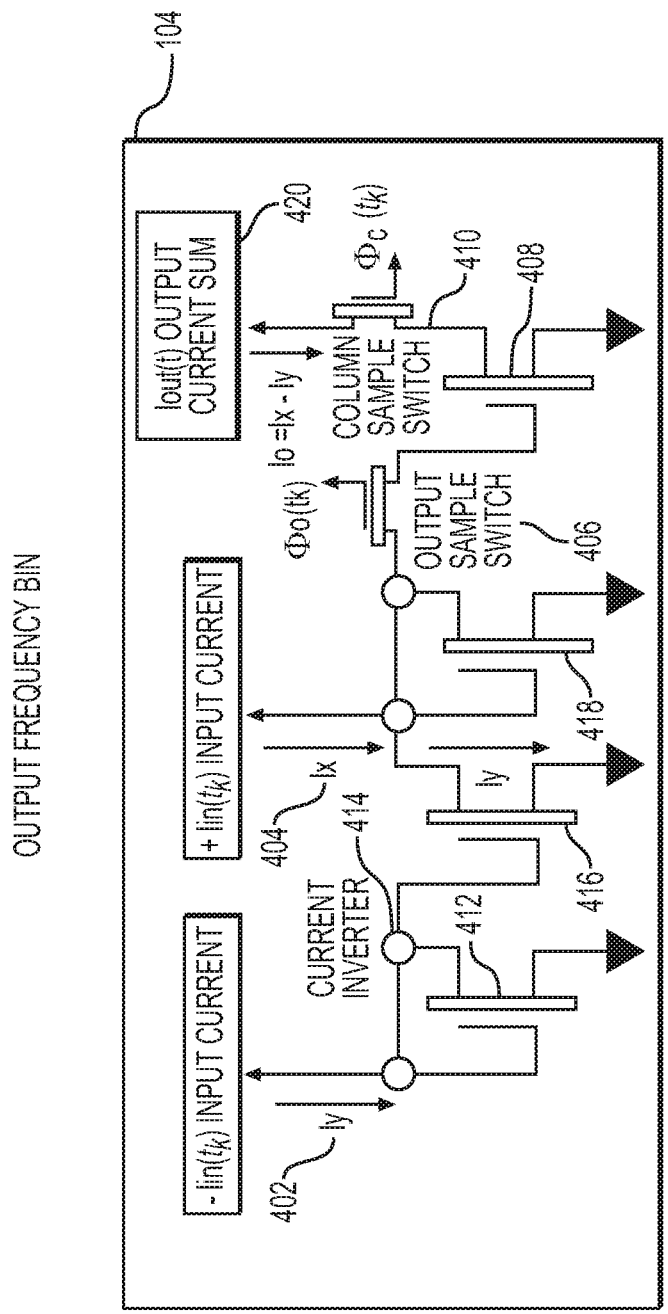
FIG. 4 discloses an exemplary output frequency bin.

FIG. 4 discloses an exemplary output frequency bin 104. The output frequency bin 104 represents a certain frequency span in Hertz, and the signals in that frequency span are collected in that frequency bin. Generally, in one implementation, a frequency bin provides the magnitude of all of the frequency components in that bin.

The output frequency bins 104 are a combination of circuitry that collects multiple inputs from the RF pixels 102 multiplied by weighting functions and adding and subtracting in a way that they store the signal in the frequency bin.

The output from the weighted current outputs 1-4 (212-218) of FIG. 2 are input into the inputs 402-404 of the output frequency bin 104 on FIG. 4. In one implementation, they may be scaled in amplitude first. The final output is stored in the output frequency bin 104.

The routing of the weighted output currents 212-218 of the RF pixels 102 to the inputs 402-404 of the output frequency bins 104 is determined by the Fast Fourier Transform being used, and governed by the size of the Fast Fourier Transform used. When the Fourier Transform is known, the specific routing of the weighted current outputs 212-218 of the RF pixels 102 to the inputs 402-404 in the output frequency bin 104 may be determined and created.

In one implementation, there are half as many output frequency bins 104 as RF pixels 102. For example, in one embodiment, there may be one output frequency bin 104 for every two RF pixels 102.

Although the outputs of the weighted current outputs 212-218 come in as inputs on the output frequency bins 104, the weighted current outputs 212-218 of an RF pixel 102 do not typically come into the same output frequency bin 104, but are fanned out and distributed according to the mapping determined by the Fast Fourier Transform. For example, a given weighted current output 212-218 may be replicated many times by going into many output frequency bin 104 inputs.

The mapping of, for example, 4 outputs on an RF pixel 102 to 2 inputs on the output frequency bin 104 depends Fourier transform size being used. If a Fourier transform size is chosen, the mathematics of the Fourier transform size determines how to connect those together. Although 2 output frequency bin inputs are shown, there may be many more inputs, output frequency bins, and RF pixels than shown. The output frequency bin 104 produces the Fourier result, by doing the proper mathematics on the input signals. The circuitry in FIG. 4 is part of that mathematical operation. The output sample switch 406 is a transistor that stores that result of the analog mathematical operations from the RF pixel 102 into the output frequency bin 104.

Furthermore, the routing and mapping of outputs of weighted current outputs 212-218 of the RF pixels 102 to the inputs of the output frequency bins 104 may be programmable. The Fourier Transform and its size may be programmed and the interconnections determined programmatically.

The output frequency bin 104 ultimately stores this resulting signal in the output frequency bin in the same way the RF input signal 202 is stored on the pixel output mirror device 206. The signal is captured and stored on the transistor 408, which has a smaller transistor on its gate and a smaller transistor on its gain. That transistor 408 captures the signal in its gate oxide and holds it. Even if the output sample switch 406 and the column sample switch 410 is gated off, the charge will remain on the gate oxide of the transistor 408 for a length of time in which will store the current that is the net sum of the different signals that come in.

The output frequency bin 104 outputs the difference in the current between the inputs 402-404. For example, on FIG. 4, two inputs 402-404 are shown having a current Iy and a current Ix. The output frequency in output current 420 (Iout(t)) is the difference between Ix and Iy (i.e., Io=Ix−Iy).

As shown, the input current Iy 402 enters the output frequency bin 104 and is supplied to an NMOS transistor 412 and current inverter 414. This current inverter 414 makes the input current Iy get subtracted from the input current Ix. Also shown are two more NMOS transistors 416 and 418. The current representing the difference between the two currents Iy on input 402 and Ix on input 404 is sent to the output sample switch 406.

When this output sample switch 406 is on, the NMOS transistor 408 is turned on. Even when the output sample switch 406 is first turned off, the gate oxide will store that charge for length of time. The charge is also stored on the column sample switch 406.

Figure 5:
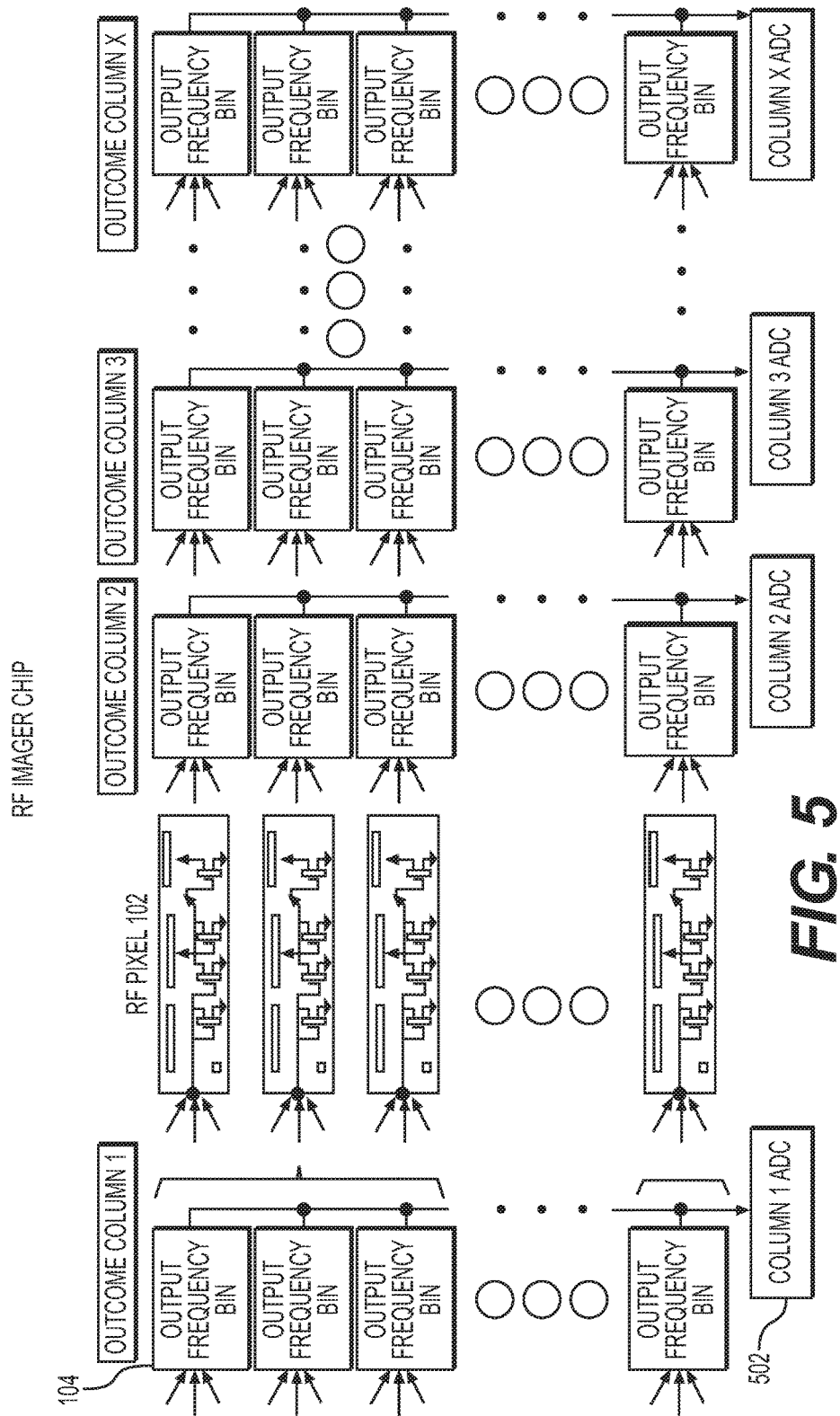
FIG. 5 displays an RF spectrum analyzer showing the output of output frequency bins to analog-to-digital converters.

FIG. 5 displays an RF spectrum analyzer showing the output of output frequency bins 104 to A/D converters 502. It shows multiple outputs of the weighted current outputs 212-218 of the RF pixels 102 going to inputs of the output frequency bins 104. As shown, the outputs 420 of the output frequency bins 104 go into A/D converters 502, one for each column or one for each row. The output 420 I(out) on FIG. 4 is the input of the A/D converter 502 (see also FIG. 5).

Ultimately, the output of the A/D converters 502 is the digital representation of the frequency domain of the RF input signal 202 shown on FIGS. 2 and 3. It can be displayed and allows viewing of the spectrum frequency domain. The A/D converters 502 are used to get the signal back to the digital domain.

An array of A/D converters 502 digitizes the output of the out frequency bins 104. By using an array, the requirements on those A/D converters are relaxed; less A/D converters 502 may be used. There may be, for example, an A/D converter 502 for each column of output frequency bins 104.

In one example, the frequency bin outputs 420 I(out) of a column of output frequency bins 104 shown on FIG. 4 are connected together and go to the A/D converter as shown on FIG. 5. When connected as a column to a single A/D converter, each one of the output frequency bins 104 could be supplied to that A/D converter 502 as the column sample switch 410 of the output frequency bin 104 on FIG. 4 was switched on an off. The A/D converter 502 digitizes each frequency bin by turning off and on each one of the column sample switches 410 on FIG. 4.

Figure 6:
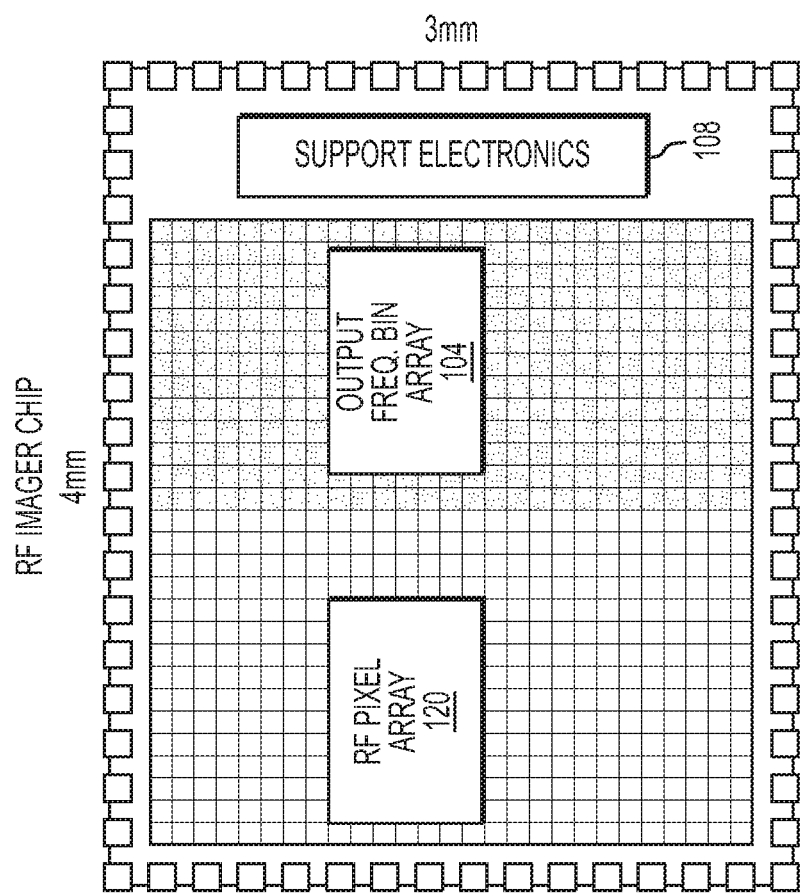
FIG. 6 illustrates an example RF Spectrum Analyzer chip.

FIG. 6 illustrates an example RF spectrum analyzer chip. In this example, the chip has 10,000 RF pixels (not all shown) which would yield 5,000 frequency bins. These would then be digitized with 100 10-bit A/D converters, contained in support electronics 108 in this example. Although the exact numbers are not shown on the Figure, an exemplary chip having 100×100 RF pixels 104 would yield 5,000 output frequency bins 104. In one implementation, there would be an A/D converter 502 for each column (or row) of output frequency bins 104, resulting in 100×100 RF pixels 102, 100×50 output frequency bins, and 100 columns of A/D converters or 50 rows of A/D converters. There may be, for example, 100 10-bit A/D converters 104. In this manner, the system can take advantage of parallel nature of the Fourier Transform.

It is also possible to digitize the RF pixels, which would display the time domain signal in the digital domain.

The output of the A/D converters 502 is digital data based on how many bits of resolution they have. Standard interface techniques may be employed to interface the A/D converters 502 to a digital system for display. As mentioned above, the output allows viewing of the spectrum frequency domain and is a digital representation of the frequency domain of the RF Input Signal. It can be displayed.

Figure 7:
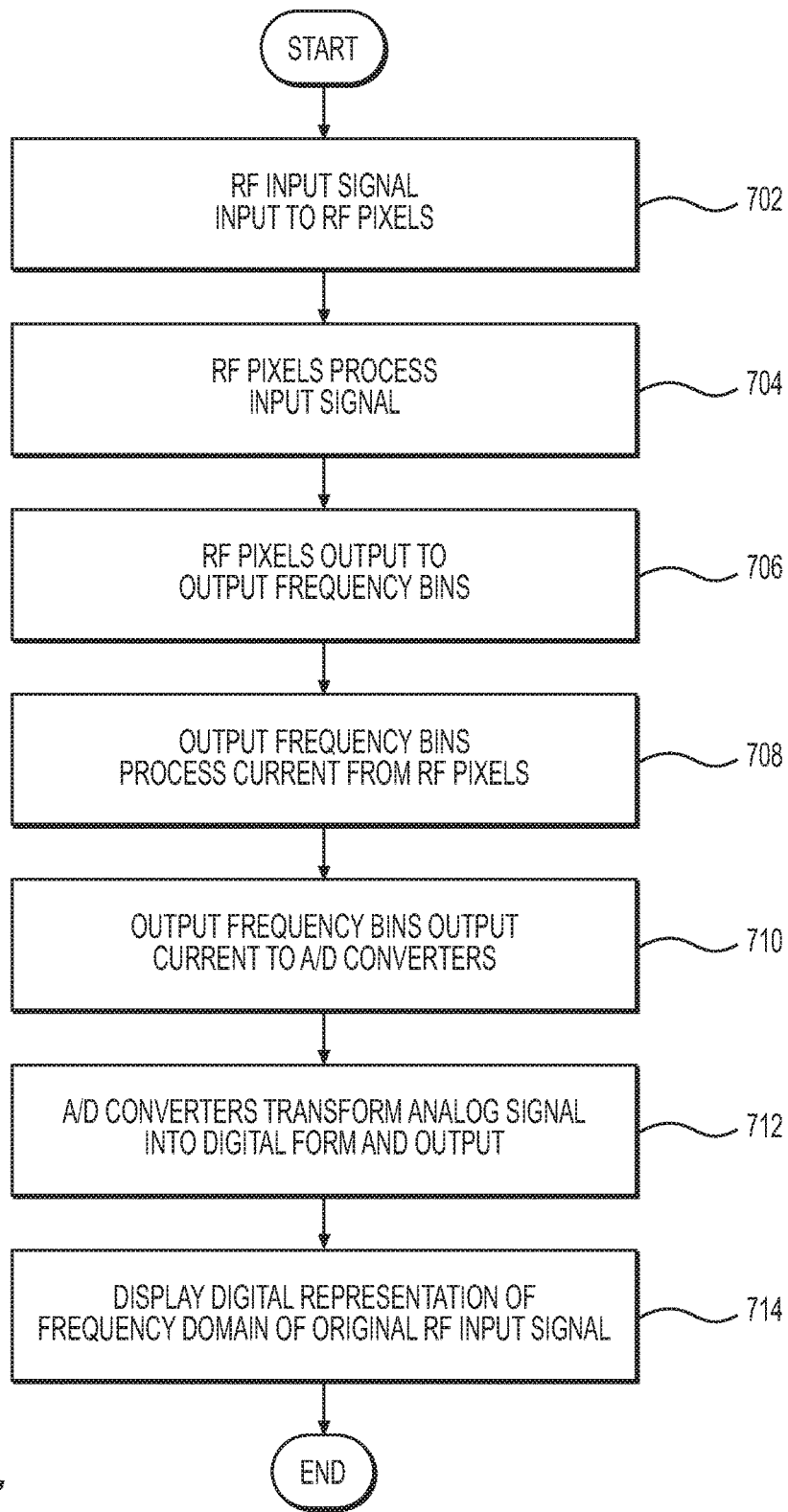
FIG. 7 illustrates a flowchart showing a high-level overview of steps in an exemplary method for implementing a single chip RF spectrum analyzer.

FIG. 7 illustrates a flowchart showing a high-level overview of steps in an exemplary method for implementing a single chip RF spectrum analyzer. First, the input signal is sent to the integrated circuit having the RF spectrum analyzer and received. Specifically, the input signal is input to the RF pixels 102 of the integrated circuit (step 702). They are processed by the RF pixels (step 704), and output to the output frequency bins 104 (step 706). The outputs 212-218 from the RF pixels 102 are then processed by the output frequency bins 104 (step 708) and output to the A/D converters (step 710). The A/D converters transform their input signal into a digital signal representing the frequency domain of the original RF input signal and output that digital signal (step 712). The digital signal may be processed and displayed (714).

Figure 8:
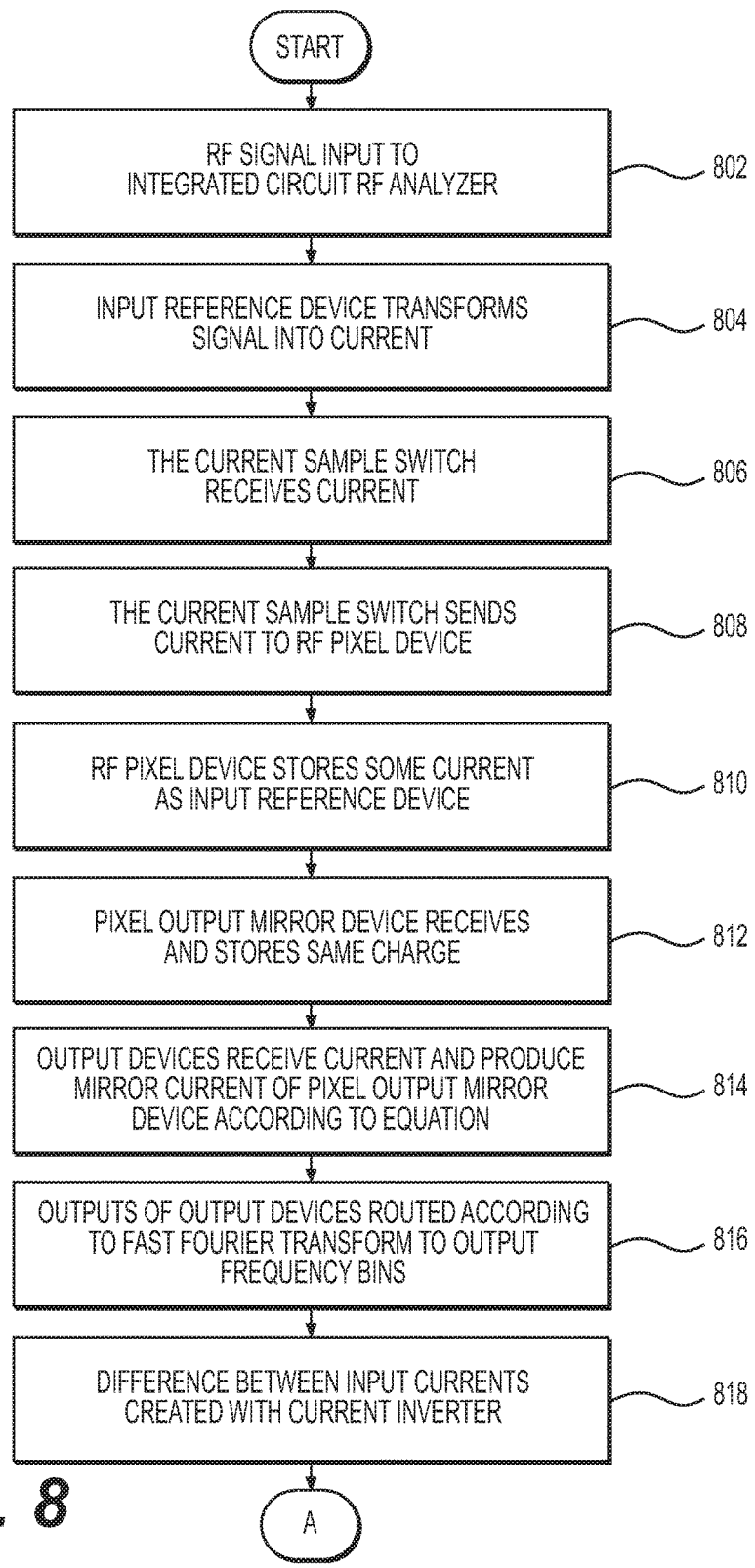
FIG. 8 shows a flowchart of steps of an exemplary method for implementing a single chip RF spectrum analyzer.
Figure 8:
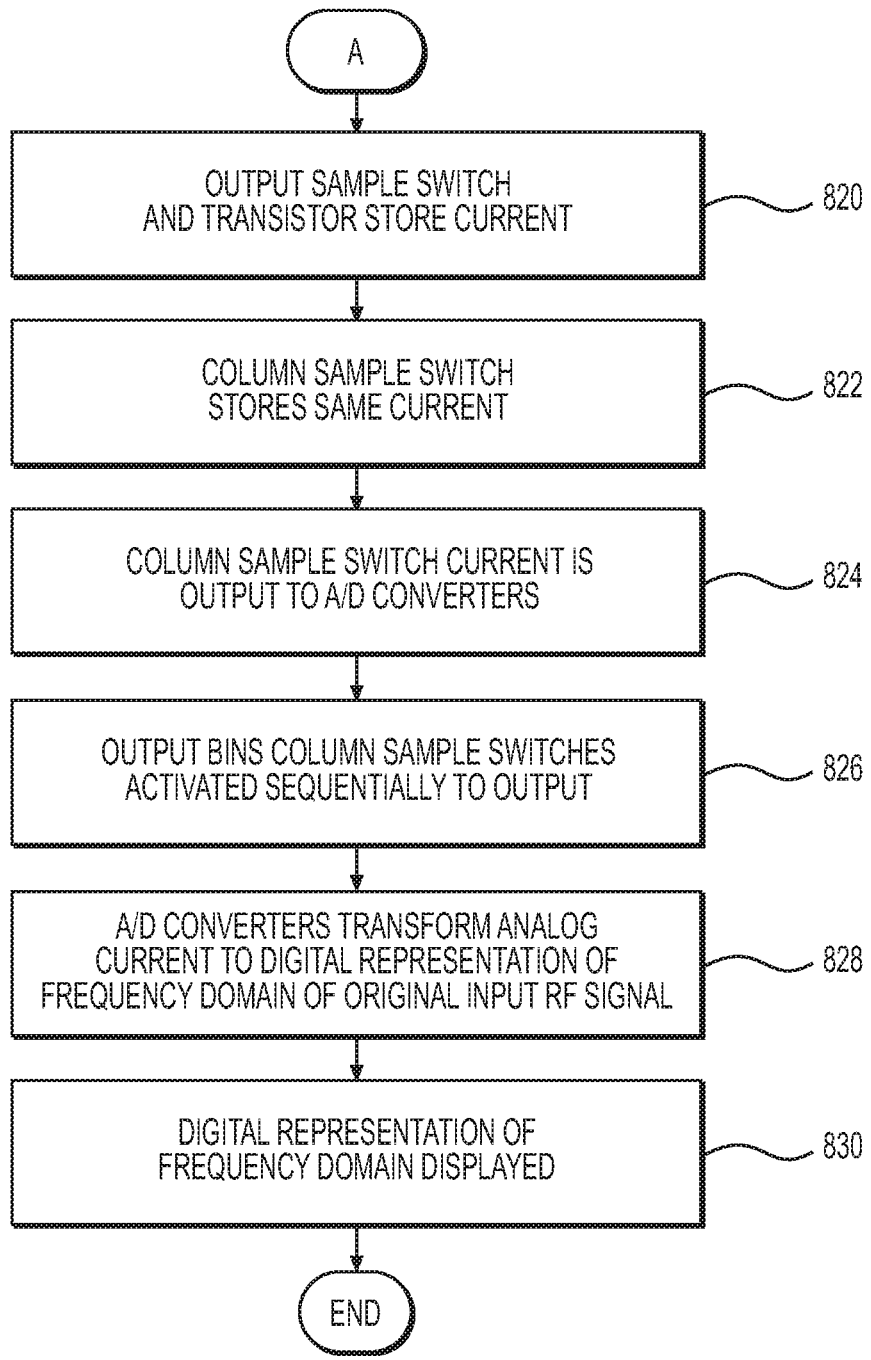

FIG. 8 shows a flowchart of steps of an exemplary method for implementing a single chip RF spectrum analyzer. An input signal is input to the integrated circuit and sent to the RF pixels 104 on the RF input (step 802). At the RF pixels 102, the signal is received by the input reference device 204 and transformed into a current (step 804). The current is sent to the sample switch 206 and stored (step 806). The sample switch 206 is closed (turned on), and the current is sent to the RF pixel device 208 (step 808). The RF pixel device 208 stores the same current that was on the input reference device 204 (step 810). Further, the pixel output mirror device 210 receives and stores this same charge (step 812).

The output devices 1-4 (212-218) receive the current of the pixel output mirror device 210, and produce a mirror current of the pixel output mirror device 210 (step 814). Specifically, in one implementation, the current of each output device 1-4 (212-218) is described in the following equation that was mentioned previously above with respect to FIG. 2:

$$Iout(tk)=Iin(tk)[B/A*D/C]$$

A is the width divided by length of input reference device's 204 dimensions when built B is the width and length RF pixel device's 208 dimensions when built C is the width and length pixel output mirror device's 210 dimension when built.

D is the width and length of the output device's 212-218 dimension when built.

Current Out (Iout(tk)) is the weighted output current at time tk. Current In (Iin(tk)) is the RF input 202 current at time tk.

The current output of each output device 1-4 (212-218) is routed, according to the Fast Fourier Transform being used, to the inputs 402 and 404 of various output frequency bins 104 (step 816). The input current 402 is routed through the current inverter 414 such that the output stored on the sample output sample switch 406 is the difference between the input current 404 and input current 402 (i.e., the output current is current 404 minus current 402) (step 818). This current is stored on the output sample switch 406, and the transistor 408 when the output sample switch is closed (turned on) (step 820). The column sample switch 410 also stores this current (step 822) that is output 420 to the A/D converters 502 when the column sample switch is closed (turned on) (step 824).

The A/D converters 502 may activate the column sample switches 106 of the output frequency bins 104 in a column sequentially to input the output currents 420 from the output frequency bins such that an A/D converter may accept a column of output frequency bins (step 826). The A/D converters 502 then transform the analog current into a digital representation of the frequency domain of the original RF input signal 202 (step 828). This digital output from the A/D converters may then be displayed (step 830).

The foregoing description of various embodiments provides illustration and description, but is not intended to be exhaustive or to limit the invention to the precise form disclosed. Modifications and variations are possible in light of the above teachings or may be acquired from practice in accordance with the present invention. It is to be understood that the invention is intended to cover various modifications and equivalent arrangements included within the spirit and scope of the appended claims.

What is claimed is:

1. A radio frequency (RF) spectrum analyzer on an integrated circuit, comprising:
    an input configured to:
        input an RF signal to be analyzed; and
        convert the input signal into a current;
    an RF pixel circuit configured to:
        receive the current representing the input signal; and
        output a second current based on the received current and dimensions of components in the RF pixel circuit;
    an output frequency bin circuit representing signals from a frequency span and configured to:
        input the second current from the RF pixel circuit; and
        store the difference between the second current and a third current input from the RF pixel; and
        output the difference current to an A/D converter; and
    an analog-to-digital (A/D) converter configured to:
        receive the difference current from the output frequency bin circuit; and
        output a digital representation of the frequency domain of the received input RF signal.

2. The radio frequency (RF) spectrum analyzer of claim 1, further comprising:
    a connection to a display, wherein the display is configured to display the digital representation of the frequency domain of the received input RF signal for viewing.

3. The radio frequency (RF) spectrum analyzer of claim 1, wherein the spectrum analyzer is on a single integrated circuit.

4. The radio frequency (RF) spectrum analyzer of claim 1, further comprising:
    a plurality of RF pixel circuits;
    a plurality of output frequency bin circuits; and
    wherein routing of connections between outputs of the plurality of RF pixel circuits and inputs of the plurality of output frequency bin circuits is based on a Fast Fourier Transform being used.

5. The radio frequency (RF) spectrum analyzer of claim 4, wherein the plurality of RF pixel circuits and the plurality of output frequency bin circuits are arranged in columns.

6. The radio frequency (RF) spectrum analyzer of claim 5, further comprising a plurality of A/D converters, and wherein there is one A/D converter for each column of the output frequency bin circuits.

7. The radio frequency (RF) spectrum analyzer of claim 6, wherein the integrated circuit has half as many output frequency bin circuits as the plurality of RF pixel circuits.

8. The radio frequency (RF) spectrum analyzer of claim 1, further comprising:
    wherein the RF pixel circuit configured to output the second current based on the received current and dimensions of components in the RF pixel circuit outputs the second current according to the formula:

$$Iout(tk)=Iin(tk)[B/A*D/C]$$

wherein:
    A is a width divided by a length of a first transistor's dimensions when built;
    B is a width and length of a second transistor's dimension when built;
    C is a width and length of a third transistor's dimension when built;
    D is a width and a length of a fourth transistor's dimension when built;
    Current Out (Iout(tk)) is the weighted output current at time tk; and
    Current In (Iin(tk)) is the RF input current at time tk.

9. A method in a radio frequency (RF) spectrum analyzer on an integrated circuit, comprising:
    receiving an input RF signal to be analyzed on the integrated circuit;
    converting the input RF signal into a current;
    receiving, by an RF pixel circuit, the current representing the input signal;
    outputting, from the RF pixel circuit, a second current based on the received current and dimensions of components in the RF pixel circuit;
    inputting, into an output frequency bin circuit representing signals from a frequency span, the second current from the RF pixel circuit;
    storing the difference between the second current and a third current input from the RF pixel in the output frequency bin circuit;
    outputting the difference current to an analog-to-digital (A/D) converter; and
    receiving, by the A/D converter, the difference current from the output frequency bin circuit; and
    outputting a digital representation of the frequency domain of the received input RF signal.

10. The method of claim 9, further comprising:
    displaying the digital representation of the frequency domain of the received input RF signal.

11. The method of claim 9, further comprising:
    routing connections between outputs of a plurality of RF pixel circuits and inputs of the plurality of output frequency bin circuits on the integrated circuit based on a Fast Fourier Transform being used.

12. The method of claim 11, wherein the plurality of RF pixel circuits and the plurality of output frequency bin circuits are arranged in columns.

13. The method of claim 12, further comprising a plurality of A/D converters, and wherein there is one A/D converter for each column of output frequency bin circuits.

14. The method of claim 13, wherein the integrated circuit has half as many output frequency bin circuits as the plurality of RF pixel circuits.

15. The method of claim 9, wherein outputting, from the RF pixel circuit, a second current based on the received current and dimensions of components in the RF pixel circuit further comprises outputting the second current according to the formula:

$$Iout(tk) = Iin(tk)[B/A * D/C]$$

wherein:
- A is a width divided by a length of a first transistor's dimensions when built;
- B is a width and length of a second transistor's dimension when built;
- C is a width and length of a third transistor's dimension when built;
- D is a width and length of a fourth transistor's dimension when built;
- Current Out (Iout(tk)) is the weighted output current at time tk; and
- Current In (Iin(tk)) is the RF input current at time tk.

* * * * *